US012700718B2

(12) United States Patent　　(10) Patent No.:　US 12,700,718 B2
Tan et al.　　　　　　　　　　　 (45) Date of Patent:　　　Aug. 4, 2026

(54) HIGH-POWER SEMICONDUCTOR LIGHT-EMITTING CHIP WITH LONGITUDINAL CARRIER MODULATION AND MANUFACTURING METHOD THEREFOR

(71) Applicant: SUZHOU EVERBRIGHT PHOTONICS CO., LTD., Suzhou (CN)

(72) Inventors: Shaoyang Tan, Suzhou (CN); Jun Wang, Suzhou (CN); Lichen Zhang, Suzhou (CN); Wu Zhao, Suzhou (CN); Guoliang Deng, Suzhou (CN); Huomu Yang, Suzhou (CN); Hao Zhou, Suzhou (CN); Hong Zhang, Suzhou (CN); Xinsheng Liao, Suzhou (CN)

(73) Assignee: SUZHOU EVERBRIGHT PHOTONICS CO., LTD., Suzhou (CN)

( * ) Notice: Subject to any disclaimer, the term of this patent is extended or adjusted under 35 U.S.C. 154(b) by 113 days.

(21) Appl. No.: 18/287,176

(22) PCT Filed: May 29, 2023

(86) PCT No.: PCT/CN2023/096779
§ 371 (c)(1),
(2) Date: Oct. 16, 2023

(87) PCT Pub. No.: WO2023/213328
PCT Pub. Date: Nov. 9, 2023

(65) Prior Publication Data
US 2025/0079802 A1　　Mar. 6, 2025

(30) Foreign Application Priority Data

May 5, 2022　(CN) ........................ 202210477824.2

(51) Int. Cl.
*H01S 5/22*　　　　(2006.01)

(52) U.S. Cl.
CPC .................................. *H01S 5/2206* (2013.01)

(58) Field of Classification Search
CPC ..................................................... H01S 5/2206
See application file for complete search history.

(56) References Cited

U.S. PATENT DOCUMENTS

| | | | |
|---|---|---|---|
| 6,396,083 B1 * | 5/2002 | Ortiz ....................... | G02F 1/017 257/94 |
| 10,718,491 B1 * | 7/2020 | Raring .................. | H04B 10/116 |
| 2002/0044583 A1 * | 4/2002 | Samonji .............. | H01S 5/32308 372/46.01 |
| 2002/0051476 A1 | 5/2002 | Fukunaga | |

(Continued)

FOREIGN PATENT DOCUMENTS

| | | |
|---|---|---|
| CN | 1677777 A | 10/2005 |
| CN | 104993373 A | 10/2015 |

(Continued)

OTHER PUBLICATIONS

Zou Longfang et al., "Study on Gain Fluctuation Caused by Crosstalk in Linear Optical Amplifiers," Optical Communication Technology, Issue 6, pp. 48-50 (Jun. 15, 2005).

(Continued)

*Primary Examiner* — Deandra M Hughes

(74) *Attorney, Agent, or Firm* — Maschoff Brennan

(57) ABSTRACT

The present application provides a high-power semiconductor light-emitting chip with longitudinal carrier modulation and a manufacturing method therefor. The high-power semiconductor light-emitting chip with longitudinal carrier modulation includes: an active layer; a first semiconductor cell layer disposed on the active layer, wherein the first semiconductor cell layer includes a contact doped layer, the first semiconductor cell layer includes a plurality of current blocking regions that are disposed at least in the contact (Continued)

doped layer and distributed in a slow-axis direction, and the parts of the first semiconductor cell layer between neighboring current blocking regions act as current injection regions, wherein a current density function J(z) of current density in the active layer satisfies:

$$J(z) = (J_{op} - J_0) \cdot f(z) + J_0;$$

$$f(z) = \cfrac{N_p(z)}{\cfrac{1}{L} \cdot \int_0^L N_p(z)dz};$$

wherein $$J_0 = \alpha N_0 + bN_0^2 + cN_0^3,$$

$$N_0 = N_{tr}\exp\left(\frac{\alpha_i + a_m}{\Gamma g_0}\right);$$

and an average resistivity r(z) of corresponding current injection regions and current blocking regions at any position in the cavity-length direction satisfies $$r(z) = r_0 \cdot \frac{1}{f(z) + J_0/(J_{op} - J_0)},$$

where $r_0$ is a coefficient of r(z).

17 Claims, 5 Drawing Sheets

(56) References Cited

U.S. PATENT DOCUMENTS

| | | | |
|---|---|---|---|
| 2005/0031000 A1* | 2/2005 | Botez | H01S 5/22 |
| | | | 372/46.01 |
| 2005/0232325 A1 | 10/2005 | Ueda et al. | |
| 2010/0020836 A1 | 1/2010 | Hoffman | |
| 2016/0064899 A1* | 3/2016 | Hayakawa | H01S 5/18311 |
| | | | 372/46.013 |
| 2020/0006921 A1 | 1/2020 | Ikedo et al. | |
| 2022/0102583 A1* | 3/2022 | Baumheinrich | G02B 6/105 |
| 2022/0368111 A1* | 11/2022 | Wallis | H01S 5/341 |
| 2024/0162684 A1* | 5/2024 | Peters | H01S 5/18358 |
| 2025/0079802 A1* | 3/2025 | Tan | H01S 5/2206 |
| 2026/0110576 A1* | 4/2026 | Wang | G01J 5/0007 |

FOREIGN PATENT DOCUMENTS

| | | |
|---|---|---|
| CN | 106025796 A | 10/2016 |
| CN | 110021877 A | 7/2019 |
| CN | 110402524 A | 11/2019 |
| CN | 110739605 A | 1/2020 |
| CN | 111585170 A | 8/2020 |
| CN | 111682400 A | 9/2020 |
| CN | 112072466 A | 12/2020 |
| CN | 113366716 A | 9/2021 |
| CN | 113872049 A | 12/2021 |
| CN | 114583556 A | 6/2022 |
| JP | 2002-204032 A | 7/2002 |
| WO | 2020/123441 A2 | 6/2020 |
| WO | 2021/056617 A1 | 4/2021 |

OTHER PUBLICATIONS

CN Office Action dated Jun. 9, 2022 as received in Application No. 202210477824.2.

International Search Report and Written Opinion of the International Searching Authority dated Aug. 2, 2023 as received in Application No. PCT/CN2023/096779.

* cited by examiner

HIGH-POWER SEMICONDUCTOR LIGHT-EMITTING CHIP WITH LONGITUDINAL CARRIER MODULATION AND MANUFACTURING METHOD THEREFOR

CROSS REFERENCE TO RELATED APPLICATIONS

This application claims the priority of Chinese Patent Application No. CN202210477824.2, filed with the Chinese Patent Office on May 5, 2022 and entitled "High-Power Semiconductor Light-Emitting Chip with Longitudinal Carrier Modulation and Manufacturing Method Therefor", which is hereby incorporated by reference in its entirety.

TECHNICAL FIELD

The present application relates to the field of semiconductor technology, and in particular to a high-power semiconductor light-emitting chip with longitudinal carrier modulation and a manufacturing method therefor.

BACKGROUND

Semiconductor light-emitting chips are an important type of optoelectronic devices that can convert injected carriers into photons by radiative recombination. A traditional semiconductor light-emitting chip uses a uniform carrier injection mode, which means that carriers are uniformly distributed along an entire electrode direction, and the semiconductor light-emitting chip often adopts an asymmetric film coating mode, in which a reflection-enhanced film is formed by evaporation on one end of a cavity surface to reflect light, an anti-reflection film is formed by evaporation on the other end of the cavity surface to transmit light. When the semiconductor light-emitting chip is in a stimulated radiation state, the distribution of an optical field in a cavity is influenced by this asymmetric film coating, i.e., the photon density in the resonant cavity of the semiconductor light-emitting chip shows a trend of gradual increase in a direction from the reflection-enhanced film to the anti-reflection film (i.e., along a cavity-length direction). Due to the effect of stimulated radiation, the higher the photon density of a region, the faster the consumption of carriers, which results in uneven distribution of the actual carrier density and gain along the direction from the reflection-enhanced film to the anti-reflection film. Especially in operation with a high current away from a threshold, the uneven distribution of carriers increases progressively, and the performance of the semiconductor light-emitting chip degrades, and an optical output power decreases.

Existing semiconductor light-emitting chips use a method of uniform current injection into the ridge structure, which cannot compensate for the consumption of carriers in regions with high photon density in the cavity, and thus the existing semiconductor light-emitting chips have a large threshold current and low electro-optical conversion efficiency.

SUMMARY

Therefore, an object of the present application is to provide a high-power semiconductor light-emitting chip with longitudinal carrier modulation and a manufacturing method therefor, in order to solve the problem that semiconductor light-emitting chips have a large threshold current and low electro-optical conversion efficiency in the prior art.

The present application provides a high-power semiconductor light-emitting chip with longitudinal carrier modulation, including: an active layer; a first semiconductor cell layer disposed on the active layer, wherein the first semiconductor cell layer includes a contact doped layer, the first semiconductor cell layer includes a plurality of current blocking regions that are disposed at least in the contact doped layer and distributed in a slow-axis direction, each current blocking region extends from a rear cavity surface to a front cavity surface of the high-power semiconductor light-emitting chip with longitudinal carrier modulation, and the parts of the first semiconductor cell layer between neighboring current blocking regions act as current injection regions, wherein a current density function $J(z)$ of current density in the active layer satisfies: $J(z)=(J_{op}-J_0)\cdot f(z)+J_0$;

$$J(z) = (J_{op} - J_0) \cdot f(z) + J_0;$$

$$f(z) = \frac{N_p(z)}{\frac{1}{L} \cdot \int_0^L N_p(z)dz},$$

wherein $$J_0 = \alpha N_0 + bN_0^2 + cN_0^3,$$

$$N_0 = N_{tr}\exp\left(\frac{\alpha_i + a_m}{\Gamma g_0}\right),$$

where $J_{op}$ is a preset operating current density of the active layer, $J_0$ is a non-stimulated radiation current density when an injection current density in the active layer is equal to the preset operating current density, the non-stimulated radiation current density being equal to the sum of a carrier leakage current density, a spontaneous radiation recombination current density and a non-radiation recombination current density, $\alpha$ is a carrier leakage coefficient, b is a spontaneous radiation recombination coefficient, c is a non-radiation recombination coefficient, z is a position in the cavity-length direction of the high-power semiconductor light-emitting chip with longitudinal carrier modulation, $N_p(z)$ is a photon density of the active layer in the cavity-length direction, $f(z)$ is a normalized photon density distribution function of the active layer, $N_0$ is a carrier concentration of the active layer, L is a cavity length of the high-power semiconductor light-emitting chip with longitudinal carrier modulation, $N_{tr}$ is a transparent carrier density of the material of the active layer, $g_0$ is a gain coefficient of the material of the active layer, $\Gamma$ is an optical limiting factor of the active layer, $\alpha_i$ is an internal loss of the high-power semiconductor light-emitting chip with longitudinal carrier modulation, and $a_m$ is a cavity surface loss of the high-power semiconductor light-emitting chip with longitudinal carrier modulation; an average resistivity $r(z)$ of corresponding current injection regions and current blocking regions at any position in the cavity-length direction satisfies $$r(z) = r_0 \cdot \frac{1}{f(z) + J_0/(J_{op} - J_0)},$$

where $r_0$ is a coefficient of r(z).

Optionally, a width t(z) of any one of the current injection regions in the slow-axis direction satisfies $$t(z)/T = \left( f(z) + \frac{J_0}{J_{op} - J_0} \right)\!\bigg/\!\left( f_{max} + \frac{J_0}{J_{op} - J_0} \right),$$

where T is a distance between central axes of neighboring current blocking regions, and $f_{max}$ is a maximum value of f(z).

Optionally, the high-power semiconductor light-emitting chip with longitudinal carrier modulation is a Fabry-Perot laser, wherein $$f(z) = \frac{\exp(gz) + (1/R_1) \cdot \exp(-gz)}{(1/(Lg)) \cdot ((R_1 R_2)^{-1/2} - 1)(1 + R_1^{-1/2} R_2^{1/2})},$$

$$g = \frac{1}{2L}\ln\!\left(\frac{1}{R_1 R_2}\right),$$

where $R_1$ is a reflectivity of the front cavity surface of the high-power semiconductor light-emitting chip with longitudinal carrier modulation, $R_2$ is a reflectivity of the rear cavity surface of the high-power semiconductor light-emitting chip with longitudinal carrier modulation, and g is a gain when the injection current density of the high-power semiconductor light-emitting chip with longitudinal carrier modulation is equal to the preset operating current density.

Optionally, any one of the current blocking regions at a position corresponding to the front cavity surface of the high-power semiconductor light-emitting chip with longitudinal carrier modulation has a width of 1 µm-5 µm in the slow-axis direction.

Optionally, a distance between neighboring current blocking regions is 1 µm-5 µm.

Optionally, the material of the current blocking regions includes gallium arsenide, aluminum gallium arsenide, indium gallium phosphide, indium phosphide, indium gallium arsenide, indium gallium arsenide phosphide, gallium nitride, or aluminum gallium nitride.

Optionally, the first semiconductor cell layer further includes an upper restriction layer, which is disposed between the active layer and the contact doped layer; and the current blocking regions further extend into the upper restriction layer.

Optionally, the chip further includes a front electrode, wherein the front electrode is disposed on a side of the first semiconductor cell layer away from the active layer, and the front electrode is in contact with at least the current injection regions.

The present application also provides a manufacturing method for a high-power semiconductor light-emitting chip with longitudinal carrier modulation, including: forming an active layer; and forming a first semiconductor cell layer on the active layer, wherein the step of forming the first semiconductor cell layer includes: forming a contact doped layer; and forming, at least in the contact doped layer, a plurality of current blocking regions distributed in a slow-axis direction, wherein each current blocking region extends from a rear cavity surface to a front cavity surface of the high-power semiconductor light-emitting chip with longitudinal carrier modulation, and the parts of the first semiconductor cell layer between neighboring current blocking regions act as current injection regions, wherein a process of acquiring an average resistivity r(z) of corresponding current injection regions and current blocking regions at any position in a cavity-length direction includes: acquiring a photon density $N_p(z)$ of the active layer in the cavity-length direction; acquiring a normalized photon density distribution function f(z) of the active layer based on the photon density $N_p(z)$ of the active layer in the cavity-length direction, $$f(z) = \frac{N_p(z)}{\dfrac{1}{L} \cdot \displaystyle\int_0^L N_p(z)dz},$$

wherein where L is a cavity length of the high-power semiconductor light-emitting chip with longitudinal carrier modulation, and z is a position in the cavity-length direction of the high-power semiconductor light-emitting chip with longitudinal carrier modulation; acquiring a non-stimulated radiation current density $J_0$ when an injection current density in the active layer is equal to a preset operating current density, based on an internal loss $\alpha_i$ of the high-power semiconductor light-emitting chip with longitudinal carrier modulation, a cavity surface loss $a_m$ of the high-power semiconductor light-emitting chip with longitudinal carrier modulation, a transparent carrier density $N_{tr}$ of the material of the active layer, a gain coefficient $g_0$ of the material of the active layer, an optical limiting factor $\Gamma$ of the active layer, a carrier leakage current density coefficient $\alpha$, a spontaneous radiation recombination current density coefficient b, and a non-radiation recombination current density coefficient c, wherein $$J_0 = aN_0 + bN_0^2 + cN_0^3,$$

the non-stimulated radiation current density is equal to the sum of a carrier leakage current density, a spontaneous radiation recombination current density and a non-radiation recombination current density; and $$N_0 = N_{tr}\exp\!\left(\frac{\alpha_i + a_m}{\Gamma g_0}\right),$$

where $N_0$ is a carrier concentration of the active layer; acquiring a current density function J(z) of current density in the active layer based on the preset operating current density $J_{op}$ of the active layer and the normalized photon density distribution function f(z), wherein $$J(z) = (J - J_0) \cdot f(z) + J_0;$$

and acquiring the average resistivity r(z) of corresponding current injection regions and current blocking regions at any position in the cavity-length direction based on the current density function J(z) of current density in the active layer, wherein $$r(z) = r_0 \cdot \frac{1}{f(z) + J_0/(J_{op} - J_0)},$$

where $r_0$ is a coefficient of r(z).

Optionally, a width t(z) of any one of the current injection regions in the slow-axis direction satisfies:

$$t(z)/T = \left( f(z) + \frac{J_0}{J_{op} - J_0} \right) \Big/ \left( f_{max} + \frac{J_0}{J_{op} - J_0} \right),$$

where T is a distance between central axes of neighboring current blocking regions, and $f_{max}$ is a maximum value of f(z).

Optionally, the high-power semiconductor light-emitting chip with longitudinal carrier modulation is a Fabry-Perot laser, wherein $$f(z) = \frac{\exp(gz) + \left(1/R_1\right) \cdot \exp(-gz)}{\left(1/(Lg)\right) \cdot \left((R_1 R_2)^{-1/2} - 1\right)\left(1 + R_1^{-1/2} R_2^{1/2}\right)},$$

$$g = \frac{1}{2L} \ln\left( \frac{1}{R_1 R_2} \right),$$

where $R_1$ is a reflectivity of the front cavity surface of the high-power semiconductor light-emitting chip with longitudinal carrier modulation, $R_2$ is a reflectivity of the rear cavity surface of the high-power semiconductor light-emitting chip with longitudinal carrier modulation, and g is a gain when the injection current density of the high-power semiconductor light-emitting chip with longitudinal carrier modulation is equal to the preset operating current density.

Optionally, a process of forming, at least in the contact doped layer, the plurality of current blocking regions distributed in the slow-axis direction includes: forming a plurality of openings at least in the contact doped layer, wherein the plurality of openings are distributed in the slow-axis direction, and each opening extends from the rear cavity surface to the front cavity surface of the high-power semiconductor light-emitting chip with longitudinal carrier modulation; and forming the current blocking regions by deposition into the openings.

Optionally, the method further includes: forming an upper restriction layer on the active layer before forming the contact doped layer; and the step of forming a plurality of openings at least in the contact doped layer includes: forming the plurality of openings in both the contact doped layer and the upper restriction layer.

Optionally, a process of forming, at least in the contact doped layer, the plurality of current blocking regions distributed in the slow-axis direction includes: injecting blockage ions into parts of the contact doped layer to form the current blocking regions.

Optionally, the method further includes: forming an upper restriction layer on the active layer before forming the contact doped layer; and injecting blockage ions into parts of the contact doped layer and parts of the upper restriction layer to form the current blocking regions.

Optionally, the blockage ions include one type of ions selected from hydrogen ions and helium ions, or a combination of both hydrogen ions and helium ions.

Optionally, a process of forming, at least in the contact doped layer, the plurality of current blocking regions distributed in the slow-axis direction includes: forming a plurality of openings at least in the contact doped layer, wherein the plurality of openings are distributed in the slow-axis direction, each opening extends from the rear cavity surface to the front cavity surface of the high-power semiconductor light-emitting chip with longitudinal carrier modulation, and the openings are used to form the current blocking regions.

Optionally, the method further includes: forming an isolation layer on inner walls of the openings; and forming a front electrode on top surfaces of the current injection regions and on a surface of the isolation layer.

The technical solution of the present application has the following beneficial effects:

According to the high-power semiconductor light-emitting chip with longitudinal carrier modulation in the technical solution of the present application, the first semiconductor cell layer includes a contact doped layer, the first semiconductor cell layer includes a plurality of current blocking regions that are disposed at least in the contact doped layer and distributed in a slow-axis direction, and the parts of the first semiconductor cell layer between neighboring current blocking regions act as current injection regions, wherein a current density function J(z) of current density in the active layer satisfies:

$$J(z) = (J_{op} - J_0) \cdot f(z) + J_0 = (J_{op} - J_0) \cdot \left(f(z) + J_0/(J_{op} - J_0)\right);$$

$$f(z) = \frac{N_p(z)}{\frac{1}{L} \cdot \int_0^L N_p(z) dz};$$

the current density function of current density in the active layer is directly proportional to the sum of the photon density distribution function f(z) in the active layer and the proportion $$J_0/(J_{op} - J_0)$$

of the non-stimulated radiation current when the injection current density in the active layer is equal to the preset operating current density, such that the distribution in the cavity-length direction of current density in the active layer is same as that of an optical pattern in the cavity-length direction of the high-power semiconductor light-emitting chip with longitudinal carrier modulation; secondly, an average resistivity r(z) of corresponding current injection regions and current blocking regions at any position in the cavity-length direction satisfies:

$$r(z) = r_0 \cdot \frac{1}{f(z) + J_0/(J_{op} - J_0)},$$

such that the average resistivity of corresponding current injection regions and current blocking regions at any position in the cavity-length direction is inversely proportional to the sum of the photon density distribution function f(z) in the active layer and the proportion $$J_0/(J_{op} - J_0)$$

of the non-stimulated radiation current when the injection current density in the active layer is equal to the preset operating current density, which can fully compensate for the consumption of carriers by an optical field, so the high-power semiconductor light-emitting chip with longitudinal carrier modulation has a small threshold current and high electro-optical conversion efficiency.

BRIEF DESCRIPTION OF THE DRAWINGS

To describe technical solutions in the embodiments of the present application or in the prior art more clearly, drawings for use in description of the embodiments or the prior art will be introduced briefly below. Obviously, the drawings described below only represent some embodiments of the present application, and those of ordinary skill in the art can also obtain other drawings according to these drawings without creative work.

DETAILED DESCRIPTION

Figure 1:
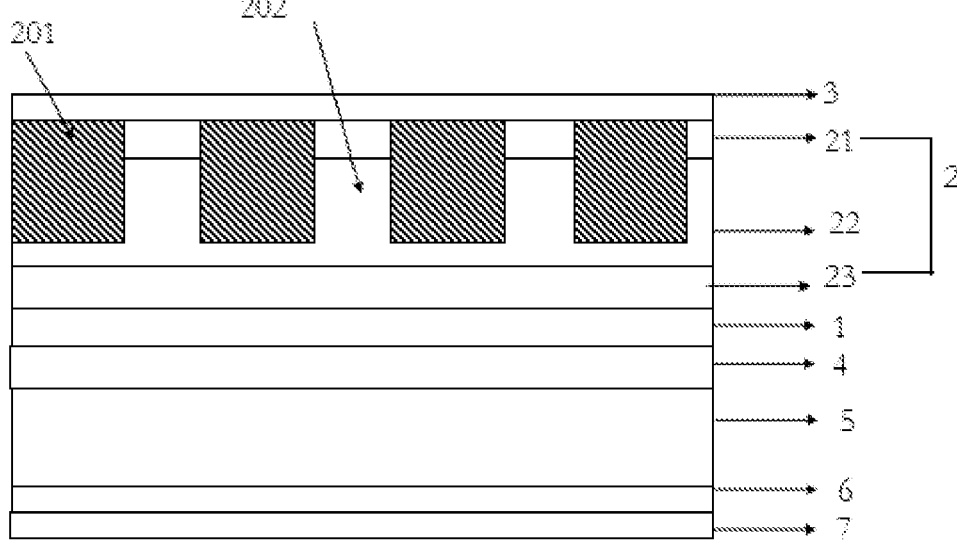
FIG. 1 is a structural diagram of a high-power semiconductor light-emitting chip with longitudinal carrier modulation provided in an embodiment of the present application.

Technical solutions of the present application will be described below clearly and completely in conjunction with the accompanying drawings. Obviously, the described embodiments are part of, instead of all of embodiments of the present application. All other embodiments obtained by those of ordinary skill in the art without creative work, based on the embodiments in the present application, fall into the protection scope of the present application.

In description of the present application, it is to be noted that orientation or location relations denoted by the terms "center", "upper", "lower", "left", "right", "vertical", "horizontal", "inner", "outer", etc. are orientation or location relations based on illustration in the drawings, are only intended to facilitate describing the present application and simplify description, instead of indicating or implying the denoted devices or elements must have specific orientations and are constructed and operated in specific orientations, and thus they should not be construed as limiting the present application. In addition, the terms "first", "second", "third", etc. are only used for description and should not be construed as indicating or implying relative importance.

In description of the present application, it is to be noted that, unless otherwise expressly specified and defined, the terms "install", "be connected with", and "be connected" should be construed in a broad sense. For example, it may indicate fixed connection, or detachable connection, or integrated connection; it may indicate mechanical connection, or electrical connection; it may indicate direct connection, or indirect connection through an intermediate medium, or internal communication between two elements. For those of ordinary skill in the art, specific meanings of the above-mentioned terms in the present application may be construed according to specific circumstances.

In addition, technical features involved in different embodiments of the present application described below may be combined with each other so long as they do not conflict with each other.

Figure 2:
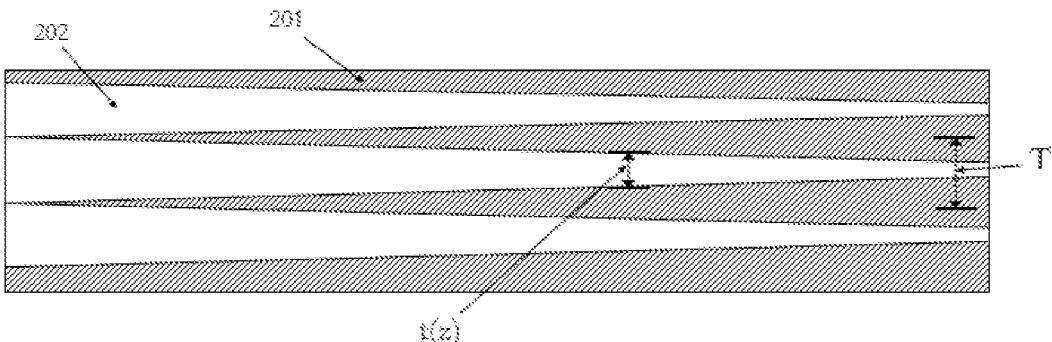
FIG. 2 is a top view of a first semiconductor cell layer provided in an embodiment of the present disclosure.

The present application provides a high-power semiconductor light-emitting chip with longitudinal carrier modulation, which includes, with reference to FIGS. 1 and 2: an active layer 1;

a first semiconductor cell layer 2 disposed on the active layer 1, wherein the first semiconductor cell layer 2 includes a contact doped layer 21, the first semiconductor cell layer 2 includes a plurality of current blocking regions 201 that are disposed at least in the contact doped layer 21 and distributed in a slow-axis direction, each current blocking region extends from a rear cavity surface to a front cavity surface of the high-power semiconductor light-emitting chip with longitudinal carrier modulation, and the parts of the first semiconductor cell layer 2 between neighboring current blocking regions 201 act as current injection regions 202, wherein a current density function J(z) of current density in the active layer satisfies:

$$J(z) = (J_{op} - J_0) \cdot f(z) + J_0;$$

$$f(z) = \frac{N_p(z)}{\frac{1}{L} \cdot \int_0^L N_p(z)\,dz}$$

wherein $$J_0 = \alpha N_0 + b N_0^2 + c N_0^3,$$

$$N_0 = N_{tr} \exp\left(\frac{\alpha_i + a_m}{\Gamma g_0}\right),$$

where $J_{op}$ is a preset operating current density of the active layer, $J_0$ is a non-stimulated radiation current density when an injection current density in the active layer is equal to the preset operating current density, the non-stimulated radiation current density being equal to the sum of a carrier leakage current density $\alpha N_0$, a spontaneous radiation recombination current density $$bN_0^2$$

and a non-radiation recombination current density $$cN_0^3,$$

$\alpha$ is a carrier leakage coefficient, b is a spontaneous radiation recombination coefficient, c is a non-radiation recombination coefficient, z is a position in the cavity-length direction of the high-power semiconductor light-emitting chip with longitudinal carrier modulation, $N_p(z)$ is a photon density of the active layer in the cavity-length direction, f(z) is a normalized photon density distribution function of the active layer, $N_0$ is a carrier concentration of the active layer, L is a cavity length of the high-power semiconductor light-emitting chip with longitudinal carrier modulation, $N_{tr}$ is a transparent carrier density of the material of the active layer, $g_0$ is a gain coefficient of the material of the active layer, $\Gamma$ is an optical limiting factor of the active layer, $\alpha_i$ is an internal loss of the high-power semiconductor light-emitting chip with longitudinal carrier modulation, and $a_m$ is a cavity surface loss of the high-power semiconductor light-emitting chip with longitudinal carrier modulation;

an average resistivity r(z) of corresponding current injection regions and current blocking regions at any position in the cavity-length direction satisfies $$r(z) = r_0 \cdot \frac{1}{f(z) + J_0/(J_{op} - J_0)},$$

where $r_0$ is a coefficient of r(z).

In this embodiment, the current density function J(z) of current density in the active layer satisfies:

$$J(z) = (J_{op} - J_0) \cdot f(z) + J_0 = (J_{op} - J_0) \cdot \left(f(z) + J_0/(J_{op} - J_0)\right);$$

$$f(z) = \frac{N_p(z)}{\frac{1}{L} \cdot \int_0^L N_p(z)\,dz};$$

the current density function of current density in the active layer is directly proportional to the sum of the photon density distribution function f(z) in the active layer and the proportion $$J_0/(J_{op} - J_0)$$

of the non-stimulated radiation current when the injection current density in the active layer is equal to the preset operating current density, such that the distribution in the cavity-length direction of current density in the active layer is same as that of an optical pattern in the cavity-length direction of the high-power semiconductor light-emitting chip with longitudinal carrier modulation; secondly, an average resistivity r(z) of corresponding current injection regions and current blocking regions at any position in the cavity-length direction satisfies:

$$r(z) = r_0 \cdot \frac{1}{f(z) + J_0/(J_{op} - J_0)},$$

such that the average resistivity of corresponding current injection regions and current blocking regions at any position in the cavity-length direction is inversely proportional to the sum of the photon density distribution function f(z) in the active layer and the proportion $$J_0/(J_{op} - J_0)$$

of the non-stimulated radiation current when the injection current density in the active layer is equal to the preset operating current density, which can fully compensate for the consumption of carriers by an optical field, so the high-power semiconductor light-emitting chip with longitudinal carrier modulation has a small threshold current and high electro-optical conversion efficiency.

It should be noted that the longitudinal direction mentioned in this embodiment refers to the direction from the rear cavity surface to the front cavity surface, and is is also parallel to a light exit direction of the high-power semiconductor light-emitting chip with longitudinal carrier modulation.

In an embodiment, a one-dimensional photon carrier rate equation for the active layer in the high-power semiconductor light-emitting chip with longitudinal carrier modulation satisfies:

$$\frac{dN(z)}{dt} = \frac{\eta_i J(z)}{qd} - \frac{N(z)}{\tau} - v_g g(z) N_p(z); \qquad \text{(formula 1)}$$

$$\frac{dN_p^+(z)}{dz} = +(\Gamma g(z) - \alpha_i) N_p^+(z); \qquad \text{(formula 2)}$$

$$\frac{dN_p^-(z)}{dz} = -(\Gamma g(z) - \alpha_i) N_p^-(z); \qquad \text{(formula 3)}$$

wherein N(z) is a carrier concentration ($cm^{-3}$) at any position in the light exit direction in the active layer, J(z) is a current density function ($cm^{-2}$) of current density in the active layer, $N_p(z)$ is a photon density ($cm^{-3}$) of the active layer in the cavity-length direction, and g(z) is a gain ($cm^{-1}$) at any position in the light exit direction of the high-power semiconductor light-emitting chip with longitudinal carrier modulation. $N(z)$, $J(z)$, $N_p(z)$ and $g(z)$ are all functions of time t and z, and z is a position of the high-power semiconductor light-emitting chip with longitudinal carrier modulation in the cavity-length direction.

$$N_p(z) = N_p^+(z) + N_p^-(z).$$

is a photon density of light in the active layer propagating from the rear cavity surface to the front cavity surface; and $N_p(z)$ is a photon density of light in the active layer propagating from the front cavity surface to the rear cavity surface.

In an embodiment, the first semiconductor cell layer 2 further includes an upper restriction layer 22. The upper restriction layer 22 is disposed between the active layer 1 and the contact doped layer 21; and the current blocking regions 201 further extend into the upper restriction layer 22.

In an embodiment, the first semiconductor cell layer 2 further includes an upper waveguide layer 23. The upper waveguide layer 23 is disposed between the active layer 1 and the upper restriction layer 22.

In an embodiment, the high-power semiconductor light-emitting chip with longitudinal carrier modulation further includes: a front electrode 3. The front electrode 3 is disposed on a side of the first semiconductor cell layer 2 away from the active layer 1, and the front electrode 3 is in contact with at least the current injection regions 202.

In an embodiment, the high-power semiconductor light-emitting chip with longitudinal carrier modulation further includes: a lower waveguide layer 4, a lower restriction layer 5, a semiconductor substrate layer 6 and a back electrode 7. The lower waveguide layer 4 is disposed on a side of the active layer 1 away from the first semiconductor cell layer 2. The lower restriction layer 5 is disposed on a side of the lower waveguide layer 4 away from the active layer 1. The semiconductor substrate layer 6 is disposed on a side of the lower restriction layer 5 away from the active layer 1. The back electrode 7 is disposed on a side of the semiconductor substrate layer 6 away from the active layer 1.

In (formula 1), $v_g$ is a group velocity (cm/s) of an overall structure composed of the upper restriction layer 22, the upper waveguide layer 23, the active layer 1, the lower waveguide layer 4, and the lower restriction layer 5. The group velocity (cm/s) is a fixed value. $\eta_i$ is a carrier injection efficiency of the active layer, q is a charge quantity of electrons in the active layer, d is a thickness (cm) of the active layer, $\tau$ is a carrier spontaneous radiation lifetime of the active layer, $\Gamma$ is an optical confinement factor of the active layer, and $\alpha_i$ is an internal loss of the high-power semiconductor light-emitting chip with longitudinal carrier modulation.

The high-power semiconductor light-emitting chip with longitudinal carrier modulation is configured such that the carrier concentration $N(z)$ at any position in the light exit direction in the active layer does not change with time, i.e.

$$\frac{dN(z)}{dt} = 0.$$

Thus, the carrier concentration $N(z)$ at any position in the light exit direction in the active layer is determined by the current density function $J(z)$ of current density in the active layer, and the distribution in the cavity-length direction of the photon density $N_p(z)$ of the active layer in the cavity-length direction.

$$\frac{N(z)}{\tau} = \frac{\eta_i J(z)}{qd} - v_g g(z) N_p(z) \qquad \text{(formula 4)}$$

On the basis of (formula 4), the carrier concentration $N(z)$ at any position in the light exit direction in the active layer is differentiated in the cavity-length direction to obtain:

$$\frac{d(N(z))}{dz} = \tau \cdot \left( \frac{\eta_i}{qd} \cdot \frac{dJ(z)}{dz} - \left( v_g g(z) \frac{dN_p(z)}{dz} + v_g N_p(z) \frac{dg(z)}{dz} \right) \right) \qquad \text{(formula 5)}$$

According to the analysis with (formula 5), the current density function $J(z)$ of current density in the active layer can be found to modulate the carrier concentration, so that the carrier concentration $N(z)$ in the active layer is uniformly distributed in the light exit direction, and $g(z)$ is uniformly distributed. That is, $$\frac{d(N(z))}{dz} = 0; \frac{d(g(z))}{dz} = 0.$$

Thus, $N(z)=N(0)=N_0$, $g(z)=g(0)=g$, where $g(0)$ is a gain at the front cavity surface of the high-power semiconductor light-emitting chip with longitudinal carrier modulation; and $N(0)$ is a carrier concentration at the front cavity surface of the high-power semiconductor light-emitting chip with longitudinal carrier modulation. Therefore, $J(z)$ should satisfy (formula 6).

$$\frac{dJ(z)}{dz} = \frac{qd}{\eta} \cdot v_g g \frac{dN_p(z)}{dz} \qquad \text{(formula 6)}$$

In order to enable the carrier concentration in the active layer to be uniformly distributed in the cavity-length direction, a gradient $$\frac{dJ(z)}{dz}$$

of the distribution in the cavity-length direction of the current density function of current density in the active layer shall be directly proportional to a photon density gradient $$\frac{d(N_p(z))}{dz}$$

of the active layer in the cavity-length direction.

Integration on left and right sides of (formula 6) may yield $$J(z) = \frac{qd}{\eta_i} \cdot v_g g N_p(z) + C, \qquad \text{(formula 7)}$$

13 wherein $$C = \frac{N_0}{\tau} = J_0,$$

where $J_0$ is a non-stimulated radiation current density when an injection current density in the active layer is equal to the preset operating current density, the non-stimulated radiation current density being equal to the sum of a carrier leakage current density, a spontaneous radiation recombination current density and a non-radiation recombination current density. A stimulated radiation condition for the high-power semiconductor light-emitting chip with longitudinal carrier modulation includes $$N_0 = N_{tr} \exp\left(\frac{g}{\Gamma g_0}\right) = N_{tr} \exp\left(\frac{\alpha_i + a_m}{\Gamma g_0}\right).$$

Therefore, $$J_0 = aN_0 + bN_0^2 + cN_0^3,$$

where $\alpha$ is a carrier leakage coefficient, b is a spontaneous radiation recombination coefficient, and c is a non-radiation recombination coefficient. $N_{tr}$ is a transparent current density of the material of the active layer, $g_0$ is a gain coefficient of the material of the active layer, $a_i$ is an internal loss of the high-power semiconductor light-emitting chip with longitudinal carrier modulation, $a_m$ is a cavity surface loss of the high-power semiconductor light-emitting chip with longitudinal carrier modulation, and $\Gamma$ is an optical limiting factor of the active layer.

According to (formula 7), we obtain $$J(z) = \frac{qd}{\eta_i} \cdot v_g g N_p(z) + J_0. \quad \text{(formula 8)}$$

Integrating (formula 8) in a z-direction yields:

$$w \cdot \int_0^L J(z)dz = w \cdot \int_0^L \frac{qd}{\eta_i} \cdot v_g g N_p(z)dz + w \cdot \int_0^L J_0 dz \quad \text{(formula 9)}$$

w is a width of the active layer in the slow-axis direction.

According to (formula 9), we obtain (formula 10).

$$I = w \cdot \frac{qd}{\eta_i} v_g g \cdot \int_0^L N_p(z)dz + J_0 Lw \quad \text{(formula 10)}$$

According to (formula 10), we obtain (formula 11).

$$\frac{qd}{\eta_i} v_g g = \frac{I - J_0 Lw}{w \cdot \int_0^L N_p(z)dz} = \frac{I/(Lw) - J_0}{\frac{1}{L} \cdot \int_0^L N_p(z)dz} = \frac{\bar{J} - J_0}{\frac{1}{L} \cdot \int_0^L N_p(z)dz} \quad \text{(formula 11)}$$

14 where I is an operating current of the active layer, and $J_{op} = I_{op}/(Lw)$.

When the operating current/is a preset operating current $I_{op}$, the average current density $\bar{J}$ is a preset operating current density $J_{op}$ of the active layer, and $J_{op} = I_{op}/(Lw)$.

$$J(z) = \frac{J_{op} - J_0}{\frac{1}{L} \cdot \int_0^L N_p(z)dz} N_p(z) + J_0 = \quad \text{(formula 12)}$$

$$(J_{op} - J_0) \cdot \frac{N_p(z)}{\frac{1}{L} \cdot \int_0^L N_p(z)dz} + J_0 = (J_{op} - J_0) \cdot f(z) + J_0$$

wherein $$f(z) = \frac{N_p(z)}{\frac{1}{L} \cdot \int_0^L N_p(z)dz} \quad \text{(formula 13)}$$

is a normalized photon density distribution function.

The current density function J(z) in (formula 12) is a solution to the current density that achieves longitudinal uniform distribution of the carrier concentration when the high-power semiconductor light-emitting chip with longitudinal carrier modulation operates at the preset operating current density $J_{op}$.

In an embodiment, the high-power semiconductor light-emitting chip with longitudinal carrier modulation is a Fabry-Perot laser, $$N_p^+(z) = A \exp(gz), \text{ and } N_p^-(z) = B \exp(g(L - z)),$$

wherein $$A = N_p^+(0); \text{ and } B = N_p^-(L),$$

where $$N_p^+(0)$$

is a photon density, at the front cavity surface, of light propagating in the light exit direction in the active layer; and $$N_p^-(L)$$

is a carrier photon density, at the rear cavity surface, of light propagating in the light exit direction in the active layer.

According to a threshold condition formula for the high-power semiconductor light-emitting chip with longitudinal carrier modulation, we obtain:

$R_1 * \exp(gL) * R_2 * \exp(gL) = 1$, from which we obtain exp $(gL) = (R_1 * R_2)^{-1/2}$, where $R_1$ is a reflectivity of the front cavity surface of the high-power semiconductor light-emitting chip with longitudinal carrier modulation, $R_2$ is a reflectivity of the rear cavity surface of the high-power semiconductor light-emitting chip with longitudinal carrier modulation, L is a cavity length of the high-power semiconductor light-emitting chip with longitudinal carrier modulation, and g is a gain when the injection current density of the high-power semiconductor light-emitting chip with longitudinal carrier modulation is equal to the preset operating current density.

$$N_p(z) = \qquad\qquad\qquad\text{(formula 14)}$$

$$N_p^+(z) + N_p^-(z) = A\exp(gz) + A\exp(gL) * R_2 * \exp(g(L-z)) =$$
$$A(\exp(gz) + \exp(gL) * R_2 * \exp(g(L-z))).$$

Integrating (formula 14) yields:

$$\int_0^L N_p(z)dz = A\frac{1}{g}\left((R_1R_2)^{-1/2} - 1\right)\left(1 + R_1^{-1/2}R_2^{1/2}\right),$$

$$\text{wherein } g = \frac{1}{2L}\ln\left(\frac{1}{R_1R_2}\right).$$

Thus, $$f(z) = \frac{\exp(gz) + \left(1/R_1\right)\cdot\exp(-gz)}{\left(1/(Lg)\right)\cdot\left((R_1R_2)^{-1/2} - 1\right)\left(1 + R_1^{-1/2}R_2^{1/2}\right)}.$$

Based on the foregoing, a solution that achieves longitudinal uniform distribution of the carrier concentration in the active layer is obtained as follows:

$$J(z) = (J_{op} - J_0)\cdot\frac{\exp(gz) + \left(1/R_1\right)\cdot\exp(-gz)}{\left(1/(Lg)\right)\cdot\left((R_1R_2)^{-1/2} - 1\right)\left(1 + R_1^{-1/2}R_2^{1/2}\right)} + J_0.$$

The sum U of a potential from a front electrode to an upper surface of the active layer and a potential from the back electrode to a lower surface of the active layer is same at each position in the cavity-length direction. A band gap of the active layer remains constant. Thus, the current density function of current density in the active layer is $J(z)=U/r(z)$. Then, we obtain an average resistivity $r(z)$ of corresponding current injection regions and current blocking regions at any position in the cavity-length direction:

$$r(z) = $$

$$U/J(z) = \frac{U}{(J_{op} - J_0)\cdot f(z) + J_0} = \frac{U}{J_{max}}\cdot\frac{J_{max}}{(J_{op} - J_0)\cdot\left(f(z) + J_0/(J_{op} - J_0)\right)} =$$

$$r_i\cdot\frac{(J_{op} - J_0)\cdot\left(f_{max} + J_0/(J_{op} - J_0)\right)}{(J_{op} - J_0)\cdot\left(f(z) + J_0/(J_{op} - J_0)\right)} =$$

$$r_i\cdot\left(f_{max} + J_0/(J_{op} - J_0)\right)\cdot\frac{1}{f(z) + J_0/(J_{op} - J_0)},$$

where $J_{max}$ is a maximum value of $J(z)$ in the z-direction, and $J_{max}$ corresponds to a current density in the active layer at the front cavity surface. That is the location of a left boundary in FIG. 2. $r_i$ corresponds to a face resistance of each current injection region in a direction perpendicular to a surface of the semiconductor substrate layer; the current injection region includes a first layer of current injection region to a Qth layer of current injection region from the bottom to the top, Q is an integer greater than or equal to 2, and k is an integer greater than or equal to 1 and less than or equal to Q.

$$r_i = \sum_{k=1}^Q \rho_k h_k, \text{ where } \rho_k$$

is a resistivity of a kth layer of current injection region, and $h_k$ is a thickness of the kth layer of current injection region. $r_0$ is a coefficient of r(z), and $$r_0 = r_i * \left(f_{max} + J_0/(J_{op} - J_0)\right).$$

Figure 3:
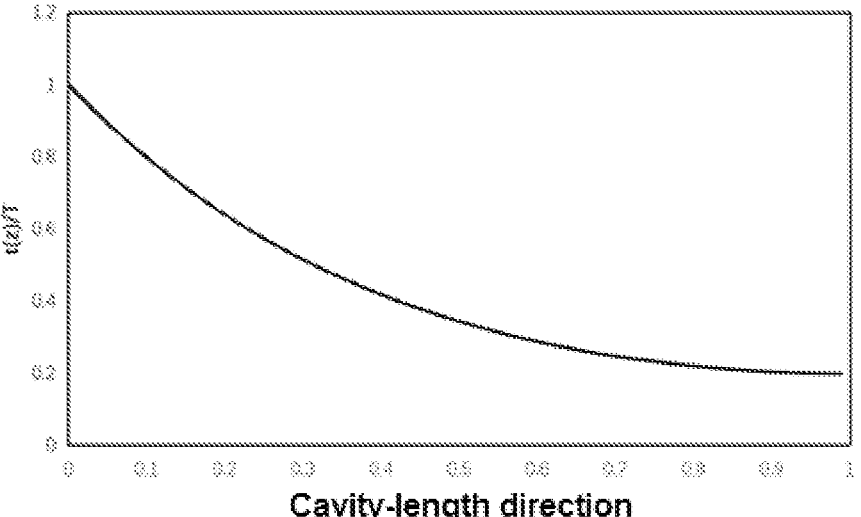
FIG. 3 is a schematic diagram of a width in a slow-axis direction of a current injection region in a cavity-length direction provided in an embodiment of the present application.

In an embodiment, a width t(z) of any one of the current injection regions in the slow-axis direction satisfies:

$$t(z)/T = \left(f(z) + \frac{J_0}{J_{op} - J_0}\right)\left(f_{max} + \frac{J_0}{J_{op} - J_0}\right),$$

where T is a distance between central axes of neighboring current blocking regions, and $f_{max}$ is a maximum value of f(z). Specifically, with reference to FIG. 3, the width t(z) of any one of the current injection regions in the slow-axis direction progressively decreases from the front cavity surface of the high-power semiconductor light-emitting chip with longitudinal carrier modulation to the rear cavity surface of the high-power semiconductor light-emitting chip with longitudinal carrier modulation, which is favorable for achieving that the distribution in the cavity-length direction of current density in the active layer of the high-power semiconductor light-emitting chip with longitudinal carrier modulation is same as that in the cavity-length direction of an optical pattern of the high-power semiconductor light-emitting chip with longitudinal carrier modulation, to achieve the effect of compensating for the consumption of carriers by an optical field.

In an embodiment, the high-power semiconductor light-emitting chip with longitudinal carrier modulation is a Fabry-Perot laser; and $$f(z) = \frac{\exp(gz) + \left(1/R_1\right)\cdot\exp(-gz)}{\left(1/(Lg)\right)\cdot\left((R_1R_2)^{-1/2} - 1\right)\left(1 + R_1^{-1/2}R_2^{1/2}\right)},$$

$$g = \frac{1}{2L}\ln\left(\frac{1}{R_1R_2}\right).$$

where $R_1$ is a reflectivity of the front cavity surface of the high-power semiconductor light-emitting chip with longitudinal carrier modulation, $R_2$ is a reflectivity of the rear cavity surface of the high-power semiconductor light-emitting chip with longitudinal carrier modulation, and g is a gain when the injection current density of the high-power semiconductor light-emitting chip with longitudinal carrier modulation is equal to the preset operating current density.

In an embodiment, any one of the current blocking regions at a position corresponding to the front cavity surface of the high-power semiconductor light-emitting chip with longitudinal carrier modulation has a width of 1 μm-5 μm in the slow-axis direction, such as being 2 μm, 2.5 μm, or 3 μm. If the width of any one of the current blocking regions in the slow-axis direction at a position corresponding to the front cavity surface of the high-power semiconductor light-emitting chip with longitudinal carrier modulation is less than 1 μm, the too small width of any one of the current blocking regions in the slow-axis direction at a position corresponding to the front cavity surface of the high-power semiconductor light-emitting chip with longitudinal carrier modulation increases the process difficulty, and the manufacturing of the current blocking region may be difficult to implement in process. If the width of any one of the current blocking regions in the slow-axis direction at a position corresponding to the front cavity surface of the high-power semiconductor light-emitting chip with longitudinal carrier modulation is greater than 5 μm, the too large width of any one of the current blocking regions in the slow-axis direction at a position corresponding to the front cavity surface of the high-power semiconductor light-emitting chip with longitudinal carrier modulation may lead to uneven distribution of carriers in the slow-axis direction, which in turn leads to uneven distribution of the intensity of the optical pattern in the slow-axis direction.

In an embodiment, a distance between neighboring current blocking regions is 1 μm-5 μm, such as being 2 μm, 2.5 μm, or 3 μm. If the distance between neighboring current blocking regions is less than 1 μm, the too small distance between neighboring current blocking regions increases the process difficulty. If the distance between neighboring current blocking regions is greater than 5 μm, the too large distance between neighboring current blocking regions may lead to uneven distribution of carriers in the slow-axis direction, which in turn leads to uneven distribution of the intensity of the optical pattern in the slow-axis direction.

In an embodiment, the material of the current blocking regions 201 includes gallium arsenide, aluminum gallium arsenide, indium gallium phosphide, indium phosphide, indium gallium arsenide, indium gallium arsenide phosphide, gallium nitride or aluminum gallium nitride. In other embodiments, the material of the current blocking regions may also include other conductive materials.

Figure 4:
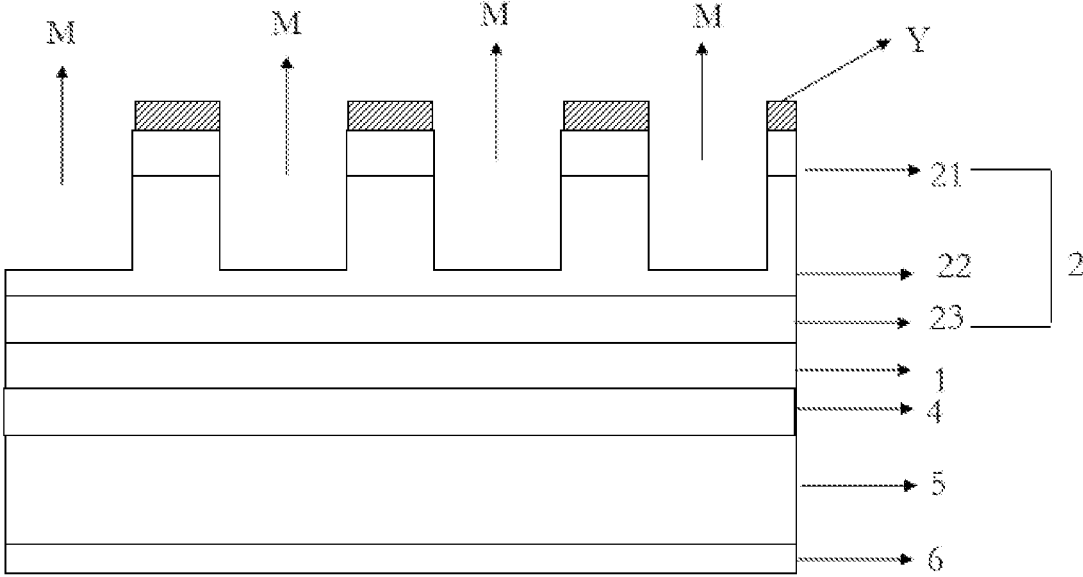
FIG. 4 is a structural diagram of forming a semiconductor substrate layer, a lower restriction layer, a lower waveguide layer, an active layer, a first semiconductor cell layer, and openings in a manufacturing process for a high-power semiconductor light-emitting chip with longitudinal carrier modulation provided in an embodiment of the present application.
Figure 5:
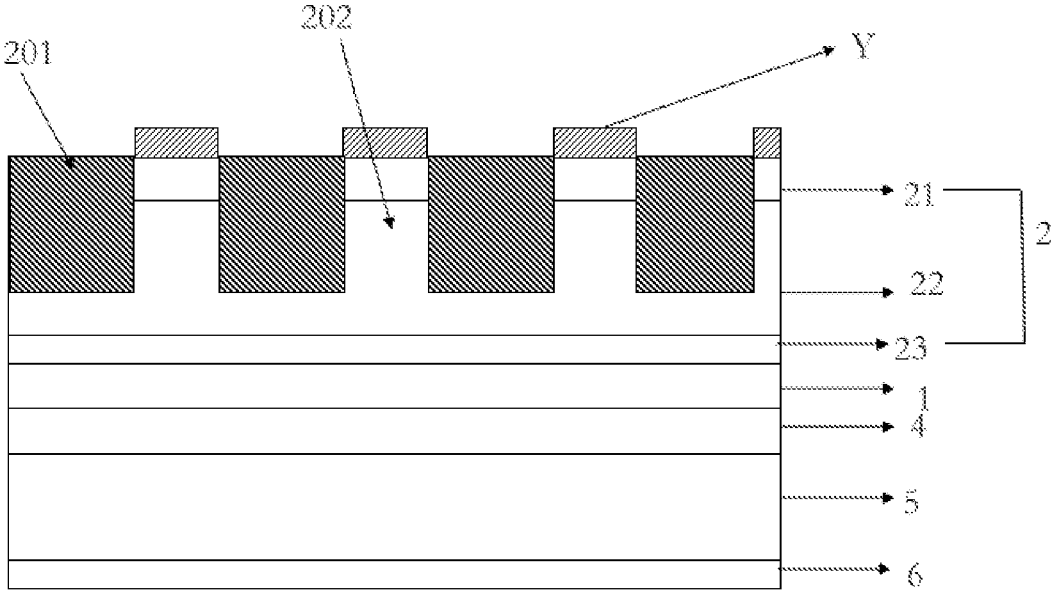
FIG. 5 is a structural diagram of forming current blocking regions based on FIG. 4.
Figure 6:
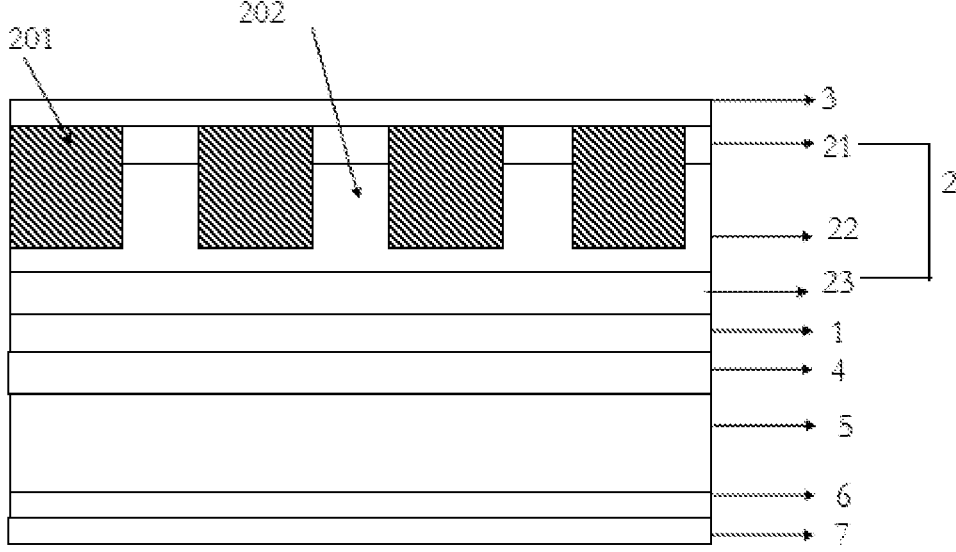
FIG. 6 is a structural diagram of forming a front electrode and a back electrode based on FIG. 5.

The present application also provides a manufacturing method for a high-power semiconductor light-emitting chip with longitudinal carrier modulation, referring to FIGS. 4 to 6, including:

forming an active layer 1; and
forming a first semiconductor cell layer 2 on the active layer 1, wherein the step of forming the first semiconductor cell layer 2 includes: forming a contact doped layer 21; and forming, at least in the contact doped layer 21, a plurality of current blocking regions 201 distributed in a slow-axis direction, wherein each current blocking region extends from a rear cavity surface to a front cavity surface of the high-power semiconductor light-emitting chip with longitudinal carrier modulation, and the parts of the first semiconductor cell layer 2 between neighboring current blocking regions 201 act as current injection regions 202,
wherein a process of acquiring an average resistivity r(z) of corresponding current injection regions and current blocking regions at any position in a cavity-length direction includes: acquiring a photon density $N_p(z)$ of the active layer in the cavity-length direction;

acquiring a normalized photon density distribution function f(z) of the active layer based on the photon density $N_p(z)$ of the active layer in the cavity-length direction, wherein $$f(z) = \frac{N_p(z)}{\frac{1}{L} \cdot \int_0^L N_p(z)dz},$$

where L is a cavity length of the high-power semiconductor light-emitting chip with longitudinal carrier modulation, and z is a position in the cavity-length direction of the high-power semiconductor light-emitting chip with longitudinal carrier modulation;

acquiring a non-stimulated radiation current density $J_0$ when an injection current density in the active layer is equal to a preset operating current density, based on an internal loss $\alpha_i$ of the high-power semiconductor light-emitting chip with longitudinal carrier modulation, a cavity surface loss $a_m$ of the high-power semiconductor light-emitting chip with longitudinal carrier modulation, a transparent carrier density $N_{tr}$ of the material of the active layer, a gain coefficient $g_0$ of the material of the active layer, an optical limiting factor $\Gamma$ of the active layer, a carrier leakage current density coefficient $\alpha$, a spontaneous radiation recombination current density coefficient b, and a non-radiation recombination current density coefficient c, wherein $$J_0 = aN_0 + bN_0^2 + cN_0^3,$$

the non-stimulated radiation current density is equal to the sum of a carrier leakage current density, a spontaneous radiation recombination current density and a non-radiation recombination current density; and $$N_0 = N_{tr} \exp\left(\frac{\alpha_i + a_m}{\Gamma g_0}\right),$$

where $N_0$ is a carrier concentration of the active layer;

acquiring a current density function J(z) of current density in the active layer based on the preset operating current density $J_{op}$ of the active layer and the normalized photon density distribution function f(z), wherein $$J(z) = (J - J_0) \cdot f(z) + J_0;$$

and
acquiring the average resistivity r(z) of corresponding current injection regions and current blocking regions at any position in the cavity-length direction based on the current density function J(z) of current density in the active layer, wherein $$r(z) = r_0 \cdot \frac{1}{f(z) + J_0/(J_{op} - J_0)},$$

where $r_0$ is a coefficient of r(z).

In an embodiment, a width t(z) of any one of the current injection regions in the slow-axis direction satisfies:

$$t(z)/T = \left(f(z) + \frac{J_0}{J_{op} - J_0}\right)\Big/\left(f_{max} + \frac{J_0}{J_{op} - J_0}\right),$$

where T is a distance between central axes of neighboring current blocking regions, and $f_{max}$ is a maximum value of f(z).

In an embodiment, the high-power semiconductor light-emitting chip with longitudinal carrier modulation is a Fabry-Perot laser, wherein $$f(z) = \frac{\exp(gz) + (1/R_1) \cdot \exp(-gz)}{(1/(Lg)) \cdot ((R_1 R_2)^{-1/2} - 1)(1 + R_1^{-1/2} R_2^{1/2})}, g = \frac{1}{2L}\ln\left(\frac{1}{R_1 R_2}\right)$$

where $R_1$ is a reflectivity of the front cavity surface of the high-power semiconductor light-emitting chip with longitudinal carrier modulation, $R_2$ is a reflectivity of the rear cavity surface of the high-power semiconductor light-emitting chip with longitudinal carrier modulation, and g is a gain when the injection current density of the high-power semiconductor light-emitting chip with longitudinal carrier modulation is equal to the preset operating current density.

In an embodiment, a process of forming, at least in the contact doped layer 21, the plurality of current blocking regions 201 distributed in the slow-axis direction includes: forming a plurality of openings M at least in the contact doped layer 21, wherein the plurality of openings M are distributed in the slow-axis direction, and each opening M extends from the rear cavity surface to the front cavity surface of the high-power semiconductor light-emitting chip with longitudinal carrier modulation; and forming the current blocking regions 201 by deposition into the openings M.

In an embodiment, a process of forming the plurality of openings M includes a dry etching process, such as an inductively coupled plasma etching process.

Specifically, a plurality of spaced-apart mask layers Y are formed in the slow-axis direction on a side of the contact doped layer 21 away from the active layer 1, and using the mask layers Y as a mask, the plurality of openings M are formed in the contact doped layer 21 and in part of the upper restriction layer 22; and the mask layers Y are removed after the current blocking regions 201 are formed by deposition. Referring to FIG. 6, after the mask layers Y are removed, a front electrode 3 is formed. The front electrode 3 is disposed on a side of the first semiconductor cell layer 2 away from the active layer 1, and the front electrode 3 is in contact with at least the current injection regions 202.

Before forming the contact doped layer 21, the method further includes: forming an upper restriction layer 22 on the active layer 1. After forming the active layer 1 and before forming the upper restriction layer 22, the method further includes: forming an upper waveguide layer 23 on an upper surface of the active layer 1. The method further includes: before forming the active layer 1, providing a semiconductor substrate layer, forming a lower restriction layer 5 and a lower waveguide layer 4 successively on the semiconductor substrate layer. The lower restriction layer 5 and the lower waveguide layer 4 are disposed between the active layer 1 and the semiconductor substrate layer 6. The lower waveguide layer 4 is disposed on a side of the lower restriction layer 5 away from the semiconductor substrate layer. After the front electrode 3 is formed, a back electrode 7 is formed on a side of the semiconductor substrate layer away from the front electrode 3.

Figure 7:
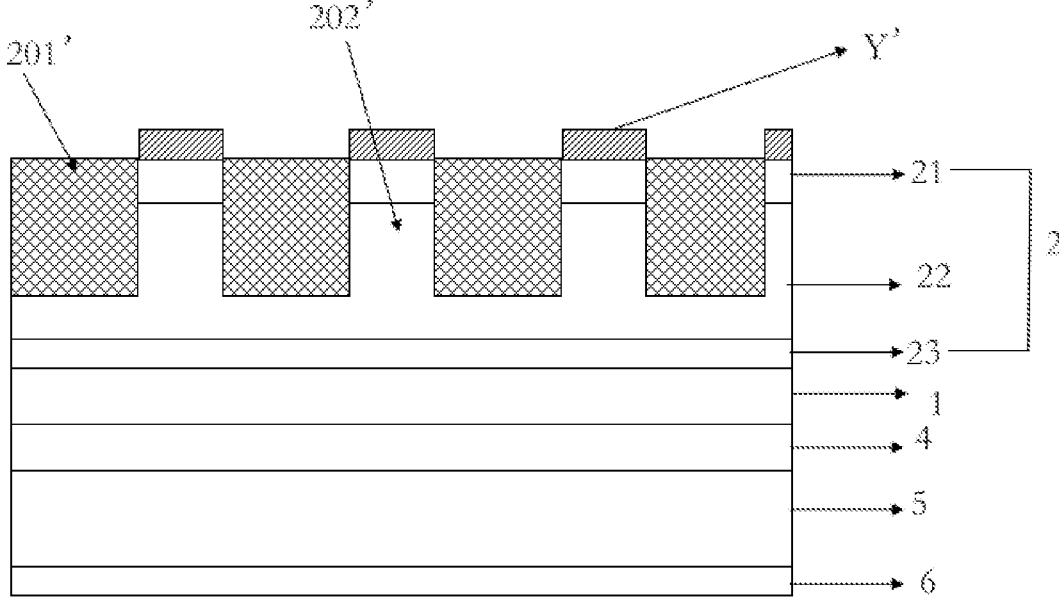
FIG. 7 shows a structural diagram of forming a semiconductor substrate layer, a lower restriction layer, a lower waveguide layer, an active layer, a first semiconductor cell layer, and current blocking regions in a manufacturing process for a high-power semiconductor light-emitting chip with longitudinal carrier modulation provided in an embodiment of the present application.

In another embodiment, a process of forming, at least in the contact doped layer, the plurality of current blocking regions distributed in the slow-axis direction includes: injecting blockage ions into parts of the contact doped layer to form the current blocking regions. Referring to FIG. 7, the method further includes: before forming the contact doped layer 21, forming an upper restriction layer 22 on the active layer 1; and injecting blockage ions into parts of the contact doped layer 21 and parts of the upper restriction layer 22 to form the current blocking regions 201'. Specifically, a plurality of spaced-apart mask layers Y' are formed in the slow-axis direction on a side of the contact doped layer 21 away from the active layer 1, and using the mask layers Y' as a mask, blockage ions are injected into parts of the contact doped layer and parts of the upper restriction layer 22 to form the current blocking regions; and subsequently, the mask layers Y' are removed.

Figure 8:
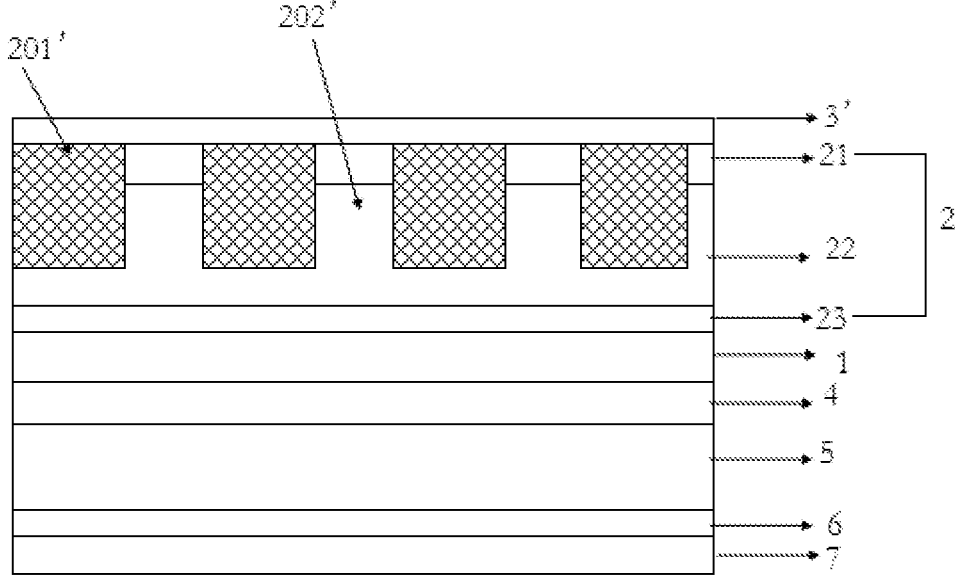
FIG. 8 is a structural diagram of forming a front electrode and a back electrode based on FIG. 7.

Referring to FIG. 8, after the mask layers Y' are removed, a front electrode 3' is formed. The front electrode 3' is disposed on a side of the first semiconductor cell layer 2 away from the active layer 1, and the front electrode 3' is in contact with at least the current injection regions 202'.

In an embodiment, the blockage ions include one type of ions selected from hydrogen ions and helium ions, or a combination of both hydrogen ions and helium ions.

Figure 9:
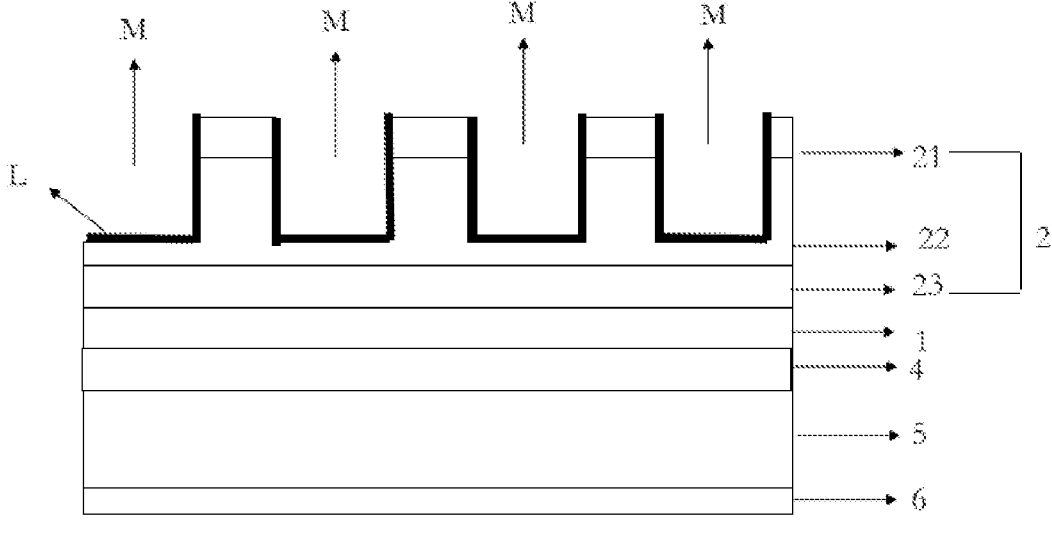
FIG. 9 is a structural diagram of forming an isolation layer based on FIG. 4.
Figure 10:
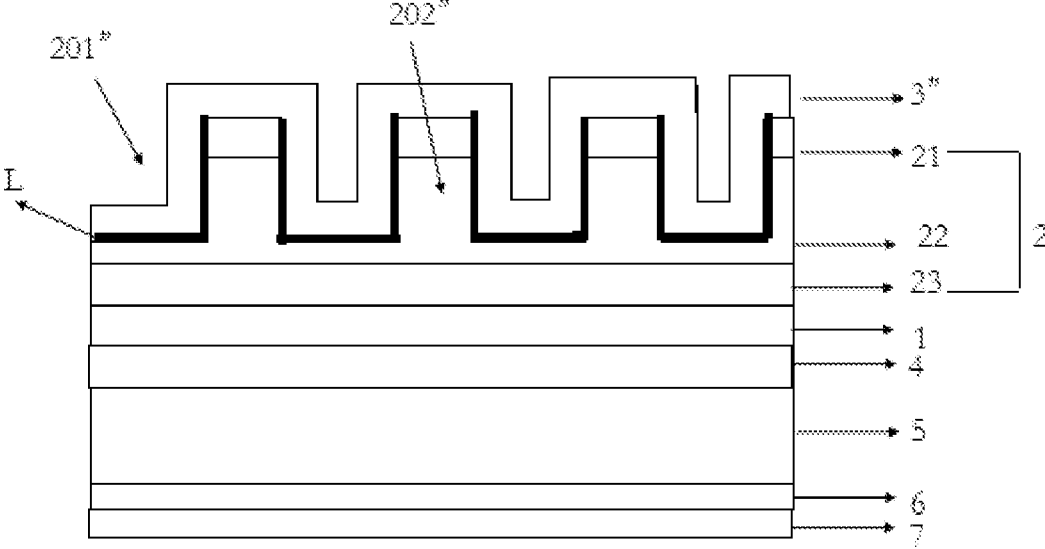
FIG. 10 is a structural diagram of forming a front electrode and a back electrode based on FIG. 9.

FIGS. 9 to 10 are structural diagrams of a manufacturing process for a high-power semiconductor light-emitting chip with longitudinal carrier modulation provided in another embodiment of the present application.

Referring to FIG. 9, a process of forming, at least in the contact doped layer 21, the plurality of current blocking regions 201" distributed in the slow-axis direction includes: forming a plurality of openings M at least in the contact doped layer 21, wherein the plurality of openings M are distributed in the slow-axis direction, each opening extends from the rear cavity surface to the front cavity surface of the high-power semiconductor light-emitting chip with longitudinal carrier modulation, and the openings M are used to form the current blocking regions 201".

In an embodiment, referring to FIG. 10, the method further includes: forming an isolation layer L on inner walls of the openings M and forming a front electrode 3" on top surfaces of the current injection regions 202" and on a surface of the isolation layer L.

Portions of this embodiment same as in the previous embodiment will not be described in detail.

Obviously, the embodiments described above are merely examples for clear description, and are not intended to limit the implementations. Other variations or modifications of various forms may also be made by those skilled in the art based on the above description. There is no need and no way to describe all implementations in an exhaustive manner here. Obvious variations or modifications derived therefrom are still within the protection scope of the present application.

The invention claimed is:

1. A high-power semiconductor light-emitting chip with longitudinal carrier modulation, comprising:
    an active layer; and
    a first semiconductor cell layer disposed on the active layer, wherein the first semiconductor cell layer comprises a contact doped layer, the first semiconductor cell layer comprises a plurality of current blocking regions that are disposed at least in the contact doped layer and distributed in a slow-axis direction, each current blocking region extends from a rear cavity surface to a front cavity surface of the high-power semiconductor light-emitting chip with longitudinal carrier modulation, and the parts of the first semiconductor cell layer between neighboring current blocking regions act as current injection regions, wherein a current density function J(z) of current density in the active layer satisfies:

$$J(z) = (J_{op} - J_0) \cdot f(z) + J_0$$

$$f(z) = \frac{N_p(z)}{\frac{1}{L} \cdot \int_0^L N_p(z) dz}$$

wherein $$J_0 = \alpha N_0 + b N_0^2 + c N_0^3,$$

$$N_0 = N_{tr} \exp\left(\frac{\alpha_i + a_m}{\Gamma g_0}\right)$$

where $J_{op}$ is a preset operating current density of the active layer, $J_0$ is a non-stimulated radiation current density when an injection current density in the active layer is equal to the preset operating current density, the non-stimulated radiation current density being equal to the sum of a carrier leakage current density, a spontaneous radiation recombination current density and a non-radiation recombination current density, $\alpha$ is a carrier leakage coefficient, b is a spontaneous radiation recombination coefficient, c is a non-radiation recombination coefficient, z is a position in the cavity-length direction of the high-power semiconductor light-emitting chip with longitudinal carrier modulation, $N_p(z)$ is a photon density of the active layer in the cavity-length direction, f(z) is a normalized photon density distribution function of the active layer, $N_0$ is a carrier concentration of the active layer, L is a cavity length of the high-power semiconductor light-emitting chip with longitudinal carrier modulation, $N_{tr}$ is a transparent carrier density of the material of the active layer, $g_0$ is a gain coefficient of the material of the active layer, $\Gamma$ is an optical limiting factor of the active layer, $\alpha_i$ is an internal loss of the high-power semiconductor light-emitting chip with longitudinal carrier modulation, and $\alpha_m$ is a cavity surface loss of the high-power semiconductor light-emitting chip with longitudinal carrier modulation;

an average resistivity r(z) of corresponding current injection regions and current blocking regions at any position in the cavity-length direction satisfies $$r(z) = r_0 \cdot \frac{1}{f(z) + J_0/(J_{op} - J_0)},$$

where $r_0$ is a coefficient of r(z); and a width t(z) of any one of the current injection regions in the slow-axis direction satisfies $$t(z)/T = \left(f(z) + \frac{J_0}{J_{op} - J_0}\right) \bigg/ \left(f_{max} + \frac{J_0}{J_{op} - J_0}\right)$$

where T is a distance between central axes of neighboring current blocking regions, and $f_{max}$ is a maximum value of f(z).

2. The high-power semiconductor light-emitting chip with longitudinal carrier modulation according to claim 1, wherein the high-power semiconductor light-emitting chip with longitudinal carrier modulation is a Fabry-Perot laser, wherein $$f(z) = \frac{\exp(gz) + (1/R_1) \cdot \exp(-gz)}{(1/(Lg)) \cdot ((R_1 R_2)^{-1/2} - 1)(1 + R_1^{-1/2} R_2^{1/2})}, \, g = \frac{1}{2L} \ln\left(\frac{1}{R_1 R_2}\right),$$

where $R_1$ is a reflectivity of the front cavity surface of the high-power semiconductor light-emitting chip with longitudinal carrier modulation, $R_2$ is a reflectivity of the rear cavity surface of the high-power semiconductor light-emitting chip with longitudinal carrier modulation, and g is a gain when the injection current density of the high-power semiconductor light-emitting chip with longitudinal carrier modulation is equal to the preset operating current density.

3. The high-power semiconductor light-emitting chip with longitudinal carrier modulation according to claim 1, wherein any one of the current blocking regions at a position corresponding to the front cavity surface of the high-power semiconductor light-emitting chip with longitudinal carrier modulation has a width of 1 μm-5 μm in the slow-axis direction.

4. The high-power semiconductor light-emitting chip with longitudinal carrier modulation according to claim 1, wherein a distance between neighboring current blocking regions is 1 μm-5 μm.

5. The high-power semiconductor light-emitting chip with longitudinal carrier modulation according to claim 1, wherein the material of the current blocking regions comprises gallium arsenide, aluminum gallium arsenide, indium gallium phosphide, indium phosphide, indium gallium arsenide, indium gallium arsenide phosphide, gallium nitride, or aluminum gallium nitride.

6. The high-power semiconductor light-emitting chip with longitudinal carrier modulation according to claim 1, wherein the first semiconductor cell layer further comprises an upper restriction layer, which is disposed between the active layer and the contact doped layer; and the current blocking regions further extend into the upper restriction layer.

7. The high-power semiconductor light-emitting chip with longitudinal carrier modulation according to claim 1, further comprising a front electrode, wherein the front electrode is disposed on a side of the first semiconductor cell layer away from the active layer, and the front electrode is in contact with at least the current injection regions.

8. A manufacturing method for a high-power semiconductor light-emitting chip with longitudinal carrier modulation, comprising:

forming an active layer; and forming a first semiconductor cell layer on the active layer, wherein the step of forming the first semiconductor cell layer comprises: forming a contact doped layer; and forming, at least in the contact doped layer, a plurality of current blocking regions distributed in a slow-axis direction, wherein each current blocking region extends from a rear cavity surface to a front cavity surface of the high-power semiconductor light-emitting chip with longitudinal carrier modulation, and the parts of the first semiconductor cell layer between neighboring current blocking regions act as current injection regions, wherein a process of acquiring an average resistivity r(z) of corresponding current injection regions and current blocking regions at any position in a cavity-length direction comprises:

acquiring a photon density $N_p(z)$ of the active layer in the cavity-length direction;

acquiring a normalized photon density distribution function f(z) of the active layer based on the photon density $N_p(z)$ of the active layer in the cavity-length direction, wherein $$f(z) = \frac{N_p(z)}{\frac{1}{L} \cdot \int_0^L N_p(z)dz},$$

where L is a cavity length of the high-power semiconductor light-emitting chip with longitudinal carrier modulation, and z is a position in the cavity-length direction of the high-power semiconductor light-emitting chip with longitudinal carrier modulation;

acquiring a non-stimulated radiation current density $J_0$ when an injection current density in the active layer is equal to a preset operating current density, based on an internal loss $\alpha_i$ of the high-power semiconductor light-emitting chip with longitudinal carrier modulation, a cavity surface loss am of the high-power semiconductor light-emitting chip with longitudinal carrier modulation, a transparent carrier density $N_{tr}$ of the material of the active layer, a gain coefficient $g_0$ of the material of the active layer, an optical limiting factor $\Gamma$ of the active layer, a carrier leakage current density coefficient $\alpha$, a spontaneous radiation recombination current density coefficient b, and a non-radiation recombination current density coefficient c, wherein $$J_0 = aN_0 + bN_0^2 + cN_0^3,$$

the non-stimulated radiation current density is equal to the sum of a carrier leakage current density, a spontaneous radiation recombination current densityc and a non-radiation recombination current density; and $$N_0 = N_{tr} \exp\left(\frac{\alpha_i + a_m}{\Gamma g_0}\right),$$

where $N_0$ is a carrier concentration of the active layer;

acquiring a current density function J(z) of current density in the active layer based on the preset operating current density $J_{op}$ of the active layer and the normalized photon density distribution function f(z), wherein $$J(z) = (J - J_0) \cdot f(z) + J_0;$$

and
acquiring the average resistivity r(z) of corresponding current injection regions and current blocking regions at any position in the cavity-length direction based on the current density function J(z) of current density in the active layer, wherein $$r(z) = r_0 \cdot \frac{1}{f(z) + J_0/(J_{op} - J_0)},$$

where $r_0$ is a coefficient of r(z);
a width t(z) of any one of the current injection regions in the slow-axis direction satisfies:

$$t(z)/T = \left(f(z) + \frac{J_0}{J_{op} - J_0}\right) \bigg/ \left(f_{max} + \frac{J_0}{J_{op} - J_0}\right)$$

where T is a distance between central axes of neighboring current blocking regions, and $f_{max}$ is a maximum value of f(z).

9. The manufacturing method for a high-power semiconductor light-emitting chip with longitudinal carrier modulation according to claim 8, wherein the high-power semiconductor light-emitting chip with longitudinal carrier modulation is a Fabry-Perot laser, wherein $$f(z) = \frac{\exp(gz) + (1/R_1) \cdot \exp(-gz)}{(1/(Lg)) \cdot ((R_1 R_2)^{-1/2} - 1)(1 + R_1^{-1/2} R_2^{1/2})}, \quad g = \frac{1}{2L} \ln\left(\frac{1}{R_1 R_2}\right),$$

$R_1$ is a reflectivity of the front cavity surface of the high-power semiconductor light-emitting chip with longitudinal carrier modulation, $R_2$ is a reflectivity of the rear cavity surface of the high-power semiconductor light-emitting chip with longitudinal carrier modulation, and g is a gain when the injection current density of the high-power semiconductor light-emitting chip with longitudinal carrier modulation is equal to the preset operating current density.

10. The manufacturing method for a high-power semiconductor light-emitting chip with longitudinal carrier modulation according to claim 8, wherein a process of forming, at least in the contact doped layer, the plurality of current blocking regions distributed in the slow-axis direction comprises: forming a plurality of openings at least in the contact doped layer, wherein the plurality of openings are distributed in the slow-axis direction, and each opening extends from the rear cavity surface to the front cavity surface of the high-power semiconductor light-emitting chip with longitudinal carrier modulation; and forming the current blocking regions by deposition into the openings.

11. The manufacturing method for a high-power semiconductor light-emitting chip with longitudinal carrier modulation according to claim 10, wherein the method further comprises: forming an upper restriction layer on the active layer before forming the contact doped layer; and the step of forming a plurality of openings at least in the contact doped layer comprises: forming the plurality of openings in both the contact doped layer and the upper restriction layer.

12. The manufacturing method for a high-power semiconductor light-emitting chip with longitudinal carrier modulation according to claim 8, wherein a process of forming, at least in the contact doped layer, the plurality of current blocking regions distributed in the slow-axis direction comprises: injecting blockage ions into parts of the contact doped layer to form the current blocking regions.

13. The manufacturing method for a high-power semiconductor light-emitting chip with longitudinal carrier modulation according to claim 12, wherein the method further comprises: forming an upper restriction layer on the active layer before forming the contact doped layer; and injecting blockage ions into parts of the contact doped layer and parts of the upper restriction layer to form the current blocking regions.

14. The manufacturing method for a high-power semiconductor light-emitting chip with longitudinal carrier modulation according to claim 12, wherein the blockage ions comprise one type of ions selected from hydrogen ions and helium ions, or a combination of both hydrogen ions and helium ions.

15. The manufacturing method for a high-power semiconductor light-emitting chip with longitudinal carrier modulation according to claim 8, wherein a process of forming, at least in the contact doped layer, the plurality of current blocking regions distributed in the slow-axis direction comprises: forming a plurality of openings at least in the contact doped layer, wherein the plurality of openings are distributed in the slow-axis direction, each opening extends from the rear cavity surface to the front cavity surface of the high-power semiconductor light-emitting chip with longitudinal carrier modulation, and the openings are used to form the current blocking regions.

16. The manufacturing method for a high-power semiconductor light-emitting chip with longitudinal carrier modulation according to claim 15, wherein the method further comprises: forming an isolation layer on inner walls of the openings; and forming a front electrode on top surfaces of the current injection regions and on a surface of the isolation layer.

17. The manufacturing method for a high-power semiconductor light-emitting chip with longitudinal carrier modulation according to claim 13, wherein the blockage ions comprise one type of ions selected from hydrogen ions and helium ions, or a combination of both hydrogen ions and helium ions.

* * * * *